United States Patent [19]

Wuu et al.

[11] Patent Number: 5,796,150
[45] Date of Patent: Aug. 18, 1998

[54] HIGH-PERFORMANCE AND RELIABLE THIN FILM TRANSISTOR (TFT) USING PLASMA HYDROGENATION WITH A METAL SHIELD ON THE TFT CHANNEL

[75] Inventors: Shou-Gwo Wuu, Chu-Tong; Kan-Yuan Lee, Hou-P; Mong-Song Liang, Hsin-Chu, all of Taiwan

[73] Assignee: Taiwan Semiconductor Manufacturing Company, Inc., Hsin-Chu, Taiwan

[21] Appl. No.: 899,673

[22] Filed: Jul. 24, 1997

Related U.S. Application Data

[62] Division of Ser. No. 684,818, Jul. 22, 1996, Pat. No. 5,686,335.

[51] Int. Cl.$^6$ .............. H01L 29/76; H01L 9/94; H01L 31/062; H01L 31/113
[52] U.S. Cl. .............. 257/401; 257/351; 257/659; 257/903
[58] Field of Search .............. 257/350, 351, 257/401, 659, 903, 904

[56] References Cited

U.S. PATENT DOCUMENTS 5,095,347  3/1992  Kirsch .................. 357/23.7
5,275,964  1/1994  Hayden et al. .......... 437/48
5,466,619  11/1995  Choi .................... 437/41
5,654,572  8/1997  Kawase ................. 257/371
5,734,187  3/1998  Bohr et al. ............ 257/377

*Primary Examiner*—Ngân V. Ngô
*Attorney, Agent, or Firm*—George O. Saile; Stephen B. Ackerman

[57] ABSTRACT

A method for fabricating thin film transistors (TFTS) for SRAM devices is described having metal shields over the channel regions for improved electrical characteristics. The method involves forming $N^+$ doped polysilicon TFT gate electrodes having a gate oxide thereon. An $N^-$ doped amorphous silicon is deposited and recrystallized. The recrystallized silicon is $P^+$ doped to form the TFT source/drain areas and patterned to form the $N^-$ doped channel regions with $P^+$ source/drain areas. After depositing an insulating layer, a metal layer is deposited and patterned to completely cover and shield the TFT channel regions from ion damage during the plasma hydrogenation which is subsequently performed. The patterned metal layer also serves as the bit lines for the SRAM device. The plasma hydrogenation reduces the surface states at the gate oxide channel interface, while the shielding effect of the metal layer from ion damaging radiation reduces the off current ($I_{off}$), increases the $I_{on}/I_{off}$ ratio of the TFTs, and improves the long-term reliability of the threshold voltage ($V_t$) and swing (S) of the TFT over the unshielded TFT.

3 Claims, 5 Drawing Sheets

FIG. 1 - Prior Art

HIGH-PERFORMANCE AND RELIABLE THIN FILM TRANSISTOR (TFT) USING PLASMA HYDROGENATION WITH A METAL SHIELD ON THE TFT CHANNEL

This Application is a Division of application Ser. No. 08/684,818, filed Jul. 22, 1996, now U.S. Pat. No. 5,686,335.

BACKGROUND OF THE INVENTION (1) Field of the Invention

The present invention relates to integrated circuits on semiconductor substrates, and more particularly relates to the fabrication of thin film transistors (TFTs) with improved electrical characteristics for Static Random Access Memory (SRAM) devices.

(2) Description of the Prior Art

Random Access Memory (RAM) devices are used in the electronics industry for storing data for digital systems, such as computers. Two major types of RAMs are the Dynamic Random Access Memory (DRAM) and the Static Random Access Memory (SRAM). The individual DRAM cells, composed of a single transistor and capacitor, store information on the capacitors as charge. In general, the DRAM is slower than the SRAM, and needs to be refreshed periodically to maintain the charge on the capacitor, but the DRAM is considerably cheaper to produce per bit of information stored than the SRAM. On the other hand, the SRAM cell is usually composed of six transistors and functions as a static latch or flip-flop circuit. Further, the SRAM does not have to be refreshed and is much faster than the DRAM. Because of its speed, the SRAM is ideal for use in specialized applications, such as cache or buffer memory, to improve system performance. More recently SRAMs are being made using thin film transistors (TFTs), which replace the load resistors in individual SRAM cells. The disadvantage of the circuit having the load resistors is the high stand-by current that results when the chip is powered up. On the other hand, the SRAM built with full-CMOS cells using thin film transistors has a much lower stand-by power, and would be desirable for battery-operated electronic equipment.

A typical circuit schematic for a prior-art six-transistor CMOS SRAM cell is shown in FIG. 1. Only one cell of the array of many cells is shown in the Fig. In recent years, the trend has been to fabricate the CMOS SRAMs using a P-channel thin film transistor (TFT) for the P1 and P2 transistors to reduce the size of the cell and to improve performance. Briefly, the SRAM cell consists of a single flip-flop circuit having cross-coupled inverters, and functions as follows. Referring to FIG. 1, an applied gate voltage on the word line WL switches on the pass transistors WN1 and WN2. The voltage at the nodes Q1 and Q2 between the two pairs of CMOS transistors P1, N1, and P2, N2, are sensed on the bit lines BL1 and BL2 during the read cycle to determine the state of the SRAM latch. During the write cycle an appropriate write voltage is applied to both bit lines to switch the voltage levels on the latch at the nodes Q1 and Q2, which remains after the write voltage is removed, and thereby one can change the state of the SRAM cell to represent data as binary one's and zero's.

Typically the P-channel thin film transistors used to replace the load transistors are poorer in electrical characteristics than the N-channel FETs made in the single crystal silicon substrate. For example, the thin film transistors P1 and P2 are made from an amorphous or poly-crystalline silicon that has a higher leakage current in the non-conducting or off state. The on current/off current ratio for the thin film transistors is therefore also poorer, and the threshold voltage swing (the gate voltage required for a decade change in drain current) is also undesirably higher. The transistor $I_{on}/I_{off}$ ratio can be dramatically improved by plasma hydrogenation, but the TFT can still have high leakage current during the stand-by state (that is, when the TFT is in the off state). Furthermore, plasma hydrogenation can degrade the TFT long-term reliability. Therefore, there is still a further need to improve the TFT.

One unconventional method of making a TFT for SRAM with reduced stand-by leakage current and improved on-to-off current ratios is described by Choi in U.S. Pat. No. 5,466,619. The method involves forming polysilicon gate electrodes, depositing a gate oxide, and then forming the TFT channels on the sidewalls of the gate electrodes by depositing and anisotropically etching back a conformal $N^-$ doped second polysilicon layer. A portion of the sidewall polysilicon layer is then ion implanted with a $P^+$ dopant to form the source/drain areas, while a portion of the sidewall polysilicon is masked to provide the TFT $N^-$ channels. The method relies on the recrystallization of polysilicon sidewalls during the source/drain implant to eliminate the grain boundaries parallel to the channel. The grain boundaries in the source/drain junctions not being parallel to the channel result in preventing, or at least reducing the leakage current generated by the electron-hole pair recombination.

Another method of improving the SRAM is described by Kirsch in U.S. Pat. No. 5,095,347, in which a higher degree of integration is achieved by forming a polarity of transistors with shared electrodes. However, Kirsch does not address the need to reduce the off current and threshold swing or increase the on-off current ratio. Hayden et al., U.S. Pat. No. 5,275,964, also address the need for laying out a more compact pair of TFT transistors for a SRAM circuit. The method employs two overlapping patterned polysilicon layers, in which one layer provides an underlying gate electrode for one of the two TFTS, and the other layer provides an overlying gate electrode for the other TFT. Although Hayden et al. teach a method for increasing the layout for reducing cell size and the number of contacts, he does not teach any methods for reducing the off current leakage, the threshold swing, or for increasing the on-off current ratio.

Although the hydrogenation and the cited reference have improved the transistor characteristics of the P-channel TFT, there is still a strong need to further reduce the leakage current, the $I_{on}/I_{off}$ current ratio, and the threshold swing.

SUMMARY OF THE INVENTION

It is a principal object of this invention to provide a process for fabricating a P-channel thin film transistor having reduced leakage current, threshold swing, and increased on/off current ($I_{on}/I_{off}$) ratios using a metal shield over the channel areas of the thin film transistor.

It is another object of this invention to provide a more reliable long-term threshold voltage ($V_t$) and threshold swing (S) by using the metal shield over the thin film transistor channel.

It is another object of this invention to provide a cell layout for a pair of P-channel thin film transistors using this metal shield.

In accordance with the objects of this invention a method is described for fabricating a pair of P-channel thin film transistors (TFTs) on an SRAM cell having metal shields over the TFT channels. The method also describes the layout of the thin film transistors for integration into the SRAM cell. The method begins by providing a P-type conductively doped single crystal semiconductor substrate having device areas on the substrate surface that are surrounded and electrically isolated by Field OXide (FOX) areas. N-channel field effect transistors (pass transistors) are formed in the device areas having gate electrodes and interconnecting word lines formed from a first polysilicon layer. The first polysilicon layer also serves to form the pair of N-channel driver transistors (FETs) in each of the SRAM cell areas.

After partially completing the SRAM cell as above, a pair of P-channel TFTs are built in each memory cell area after depositing a first insulating layer. The TFTs are formed by depositing a second polysilicon layer doped $N^+$ with an N-type dopant, such as arsenic or phosphorus. The second polysilicon layer is patterned to form the first and second gate electrodes of the two P-channel TFTs. A second insulating layer is deposited to form the gate oxide over the pair of gate electrodes. A lightly $N^-$ doped amorphous silicon layer is deposited over the gate oxide layer. The amorphous silicon layer is annealed to form a recrystallized silicon layer, forming a third polysilicon layer. The third polysilicon layer is masked from a P doping implantation over the areas where the two channel areas for the TFTs are to be formed. An ion implantation is carried out using a P-type dopant, such as boron, to form the TFT source/drain areas adjacent to the gate electrodes. The third polysilicon layer is patterned by masking and etching to form the lightly $N^-$ doped channel areas over portions of the first and second gate electrodes having $P^+$ source/drain areas adjacent to the channel areas, thereby forming a first $N^-$ doped silicon channel region over the first gate electrode, and forming a second $N^-$ doped silicon channel region over the second gate electrode. The first gate electrode extends over and electrically contacts the drain region of the second $N^-$ doped silicon channel, and the second gate electrode extends over and electrically contacts the drain of the first $N^-$ doped silicon channel. The source regions of the first and second $N^-$ doped silicon channels are also electrically connected to the power supply. A third insulating layer is deposited over the patterned third polysilicon layer, such as by depositing a silicon oxide layer by plasma enhanced chemical vapor deposition (PECVD) using, for example, tetraethosiloxane (TEOS). A metal layer is deposited over the third insulating layer, and patterned to provide metal portions that completely cover the channel regions of the TFTS. This provides metal shielding which protects the channel regions from damage during the next process step, which is a plasma hydrogenation. The substrate is now subjected to a plasma hydrogenation which is known to reduce interface traps and improve reliability. A fourth insulating layer, such as a chemical Vapor deposited (CVD) silicon oxide, is deposited over the TFT P-channels and thereby passivating and completing the pair of thin film transistors on the SRAM device. The circuit elements are then wired up to complete the SRAM device. The use of the metal shield, by the method of this invention, improves the $I_{on}/I_{off}$ ratio by about 50× over an unshielded thin film transistor. The threshold swing is improved by about 2×. Under stress tests the change in the threshold voltage is substantially reduced for the shielded TFT compared to the unshielded TFT. Also, after stress testing, the change in the threshold swing for the shielded TFTS is found to be substantially less than the unshielded TFTs.

BRIEF DESCRIPTION OF THE DRAWINGS

The objects and other advantages of the invention will become more apparent in the preferred embodiment when read in conjunction with the following drawings.

DESCRIPTION OF THE PREFERRED EMBODIMENTS

The method and structure of the present invention are now described in detail. The method involves forming a metal shield over the $N^-$ channel of the P-TFTs during fabrication to improve the electrical characteristics and the long-term reliability of the TFTs on the SRAM device. However, it should be well understood by those skilled in the art that the method can be equally applied to other semiconductor integrated circuits using P-channel TFTs where improved $I_{on}/I_{off}$ currents, threshold swing, and long-term threshold voltage ($V_{th}$) stability are desired.

Figure 1:
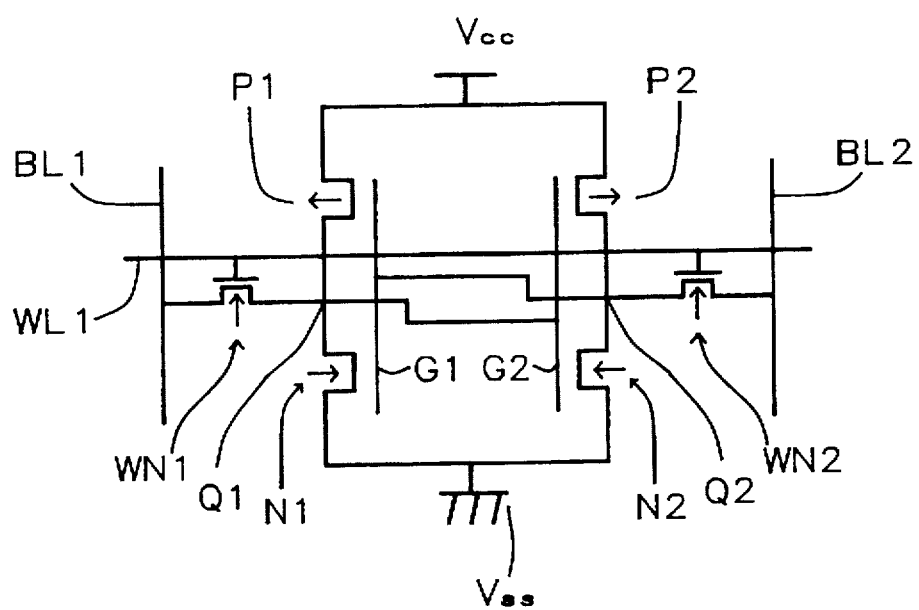
FIG. 1 shows an electrical schematic of a prior art for a six-transistor SRAM cell having a thin film transistor load.
Figure 2:
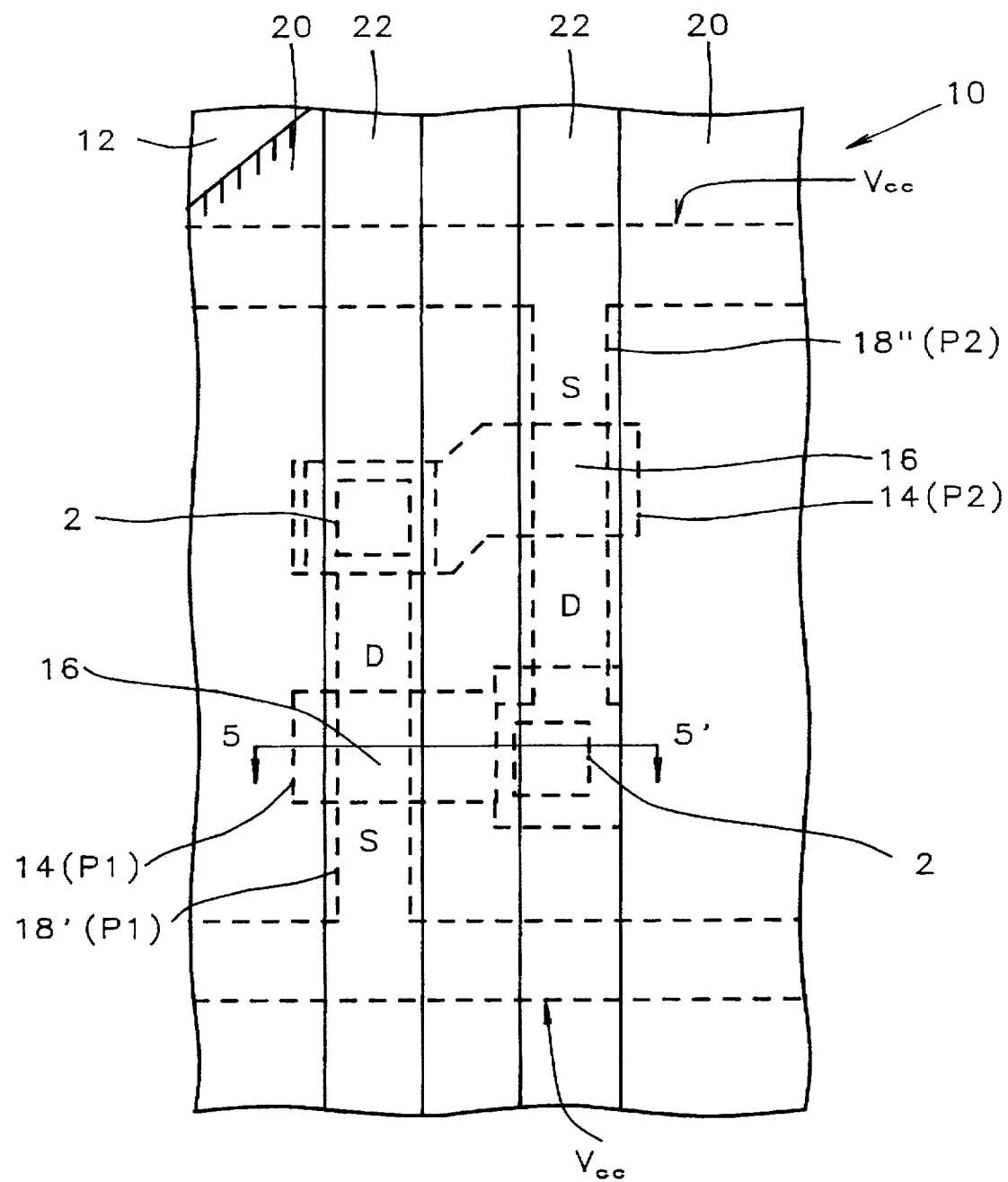
FIG. 2 is an elevational view of a layout for a pair of thin film transistors having a metal shield over the channels of the transistors for a thin film load static random access memory, by the method of this invention.

To simplify the drawing and the discussion, only the portion of the SRAM cell having the P-channel TFTs with the metal shield is shown in the layout in FIG. 2. This layout is for the P1 and P2 TFTs shown in FIG. 1 and includes the interconnection of the P1 gate to the Q2 node (drain of P2) and the interconnection of the P2 gate to the Q1 node (drain of P1). The source of each TFT (P1, P2) is electrically connected to the voltage supply $V_{cc}$, as is also shown in FIG. 1. However, it should be understood that during processing, the pair of TFTs are also integrated into the SRAM cell as depicted in the circuit schematic in FIG. 1, and further the array of SRAM cells and peripheral circuits are concurrently formed.

Referring now to FIG. 2, a schematic top view is shown of a portion of a single crystal silicon substrate 10 on which the pair of TFTs are formed. A first insulating layer 12 is deposited on the substrate surface. The gate electrodes 14 for the P1 and P2 TFT (FIG. 1) are then formed on layer 12 by depositing and patterning an $N^-$ doped second polysilicon layer. A second insulating layer 16 is deposited to form the TFT gate oxide layer 16 over the gate electrodes 14, and then after forming contact openings 2, an $N^-$ amorphous silicon layer is deposited, and recrystallized to form a third polysilicon layer. After forming $P^+$ doped source/drain areas S and D in the third polysilicon layer adjacent to the gate electrodes 14 by ion implantation, the third polysilicon layer is patterned. The patterned third polysilicon layer 18 forms the $N^-$ doped channels and source/drain areas for the TFTs, and also forms the interconnections for the $V_{cc}$ power supply voltage (also shown in FIG. 2 as $V_{cc}$). A third insulating layer 20 is then deposited over the patterned third polysilicon layer 18, and a patterned metal layer provides metal shields 22 that completely cover the channel areas of the TFTs. The metal shielding protects the channel areas from damage when the substrate is subjected to a hydrogen plasma to provide the plasma hydrogenation that reduces the surface states at the gate oxide channel interface.

Referring now to FIGS. 3–6, schematic cross-sectional views are shown for a sequence of process steps for building the thin film transistors (TFTs) having these metal shields. The TFTs are formed on a partially completed SRAM cell consisting of N channel FETs for the pass (gate) transistors WN1 and WN2, and the drive transistors N1 and N2 (as shown in FIG. 1) formed from a first polysilicon layer. The process sequence in FIGS. 3–6 is shown for a single TFT through the cross section 5–5' in FIG. 2. Although the TFTs are shown built on a portion of a silicon substrate having no underlying devices in the substrate, it should be understood that the TFTs can be built over substrate areas having the previously built devices to conserve space and to increase circuit density.

Figure 3:
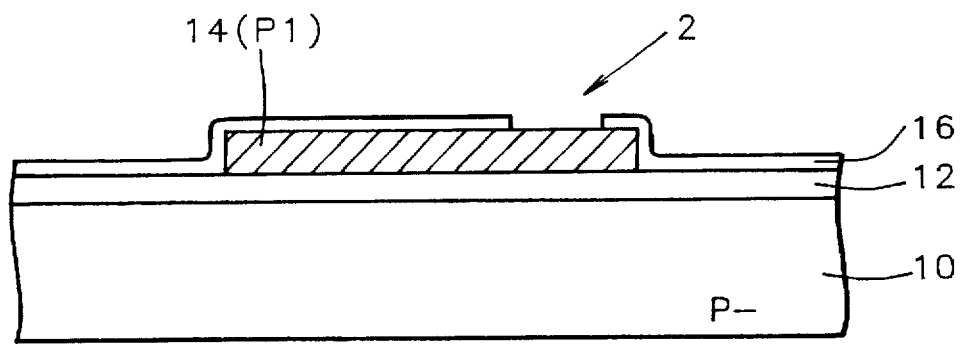
FIGS. 3 through 6 show schematic cross-sectional views through a portion of an SRAM cell. The cross sections show a sequence of process steps for one of the pair of thin film transistors having this metal shield.

Referring now to FIG. 3, the method begins by providing a semiconductor substrate 10 showing a cross-sectional view for the thin film transistor (TFT) P1 through the area 5–5' as shown in FIG. 2. The preferred substrate is composed of a P type single crystal silicon with a <100> crystallographic orientation. A first insulating layer 12 is deposited over the substrate 10 to electrically insulate the underlying devices. Preferably the first insulating layer 12 is composed of a chemical vapor deposited (CVD) oxide, such as silicon oxide ($SiO_2$). The CVD oxide can be deposited by low pressure chemical vapor deposition (LPCVD) using, for example, tetraethosiloxane (TEOS). Preferably layer 12 is deposited to a thickness of between about 700 and 3000 Angstroms.

Still referring to FIG. 3, a second polysilicon layer 14 is deposited on the first insulating layer 12, and patterned to form the gate electrode, also labeled 14 in FIG. 3, for the P1 TFT. Layer 14 is preferably deposited by low pressure chemical vapor deposition (LPCVD) using, for example, a reactant gas containing silane ($SiH_4$), and the preferred thickness of polysilicon layer 14 is between about 300 and 1000 Angstroms. Polysilicon layer 14 is then doped with an N-type dopant, such as arsenic ($As^{75}$) or phosphorus ($p^{31}$) by ion implantation, or alternatively layer 14 can be in-situ doped by adding a dopant such as arsine ($AsH_3$) or phosphine ($PH_3$) during the CVD deposition. The preferred doping concentration for layer 14 is between about 1.0 E 18 and 1.0 E 20 atoms/$cm^3$. Second polysilicon layer 14 is then patterned using conventional photolithographic techniques and anisotropic plasma etching to define the gate electrode. The preferred anisotropic plasma etching can be performed in a reactive ion etcher (RIE) using, for example, a gas mixture containing chlorine atomic species, and using a carrier gas such as argon (Ar).

A second insulating layer 16, also shown in FIG. 3, is deposited next over the gate electrode formed from layer 14. Insulating layer 16 serves as the gate oxide for the TFTs. The preferred deposition is carried out in a high temperature (about 800° C.) LPCVD system using a gas mixture, for example, composed of dichloromethane ($SiH_2Cl_2$) and nitrous oxide ($N_2O$). The gate oxide is relatively thin. For example, the preferred thickness of insulating layer 16 is between about 50 and 500 Angstroms. The contact opening 2 is etched in layer 16 to the surface of the gate electrode 14, as also shown in FIG. 3. Conventional photolithographic techniques and anisotropic plasma etching are used to form the opening 2, preferably using a gas mixture such as carbon tetrafluoride ($CF_4$) and hydrogen ($H_2$) to selectively etch the oxide to the surface of the polysilicon layer 14.

Figure 4:
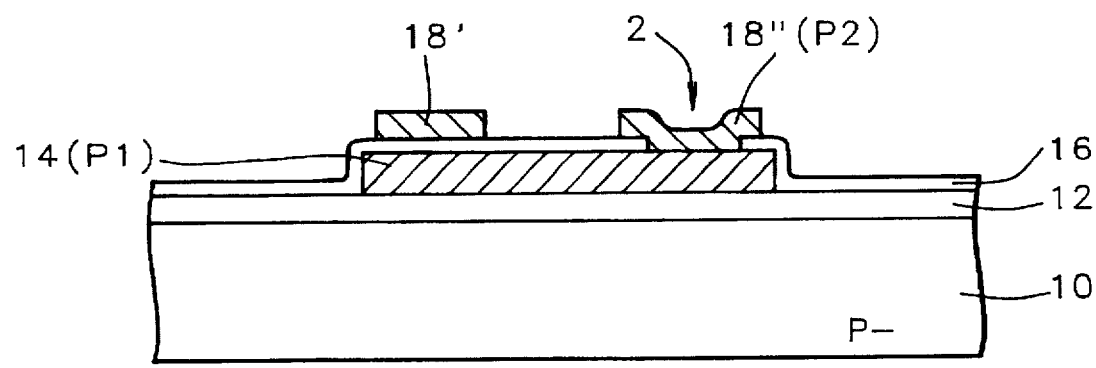

Referring to FIG. 4, a relatively thin amorphous silicon layer 18 is deposited over the gate oxide layer 16, and is patterned to provide a channel layer for the TFTs. Amorphous silicon layer 18, having a smoother surface than as-deposited polysilicon, is preferably achieved by a low temperature CVD deposition. For example, layer 18 can be deposited by LPCVD using a reactant gas containing silane ($SiH_4$) or a higher hydride of silicon such as disilane ($Si_2H_6$), and having a preferred deposition temperature in the range of between about 450° and 560° C. The preferred thickness of layer 18 is between about 50 and 800 Angstroms. Typically the amorphous silicon layer 18 is lightly doped with an N-type dopant such as arsenic (As) or phosphorus (P) to prevent inversion when the P channel FET is in a non-conducting state (off), and to provide for the $P^+$ and $N^-$ junction between the thin film FET channel and the source/drain areas. The $N^-$ dopant is typically achieved by ion implantation of arsenic ($As^{75}$) or phosphorus ($P^{31}$), and the preferred concentration in layer 18 is typically between about 1.0 E 16 and 1.0 E 18 atoms/$cm^3$. The amorphous silicon layer 18 is then annealed to form a recrystallized polysilicon layer that retains its surface smoothness. Layer 18, for the purpose of this invention, is also referred to as a third polysilicon layer. Preferably the recrystallization is carried out in an annealing furnace having an ambient gas comprised of nitrogen ($N_2$). The annealing is preferably done at a temperature of between about 580° and 620° C. for about 10 to 24 hours.

A patterned photoresist implant mask (not shown in FIG. 4) is now formed on layer 18 using conventional photolithographic techniques to mask portions of layer 18 over the gate electrode 14 where the channels for the TFTs are required. The third polysilicon layer is now subjected to an ion implantation using a P-type dopant, for example, using a boron 11 ($B^{11}$). This ion implant forms the source/drain doped regions for the P channel TFTs, and also provides a conducting layer elsewhere on the substrate. A typical $B^{11}$ dopant concentration in polysilicon layer 18 after implanting is between about 1.0 E 18 and 1.0 E 20 atoms/$cm^3$.

Still referring to FIG. 4, a conventional photolithographic technique and anisotropic plasma etching are used to pattern the third polysilicon layer 18, thereby forming the $N^-$ doped channels and the $P^+$ source/drain areas for the TFTs. As shown in FIG. 4, a portion 18' of the third polysilicon layer 18 extends over the gate electrode 14 of the P1 TFT, thereby forming the P1 TFT channel region, while another portion 18" of patterned layer 18 extends over and makes contact to the gate electrode 14 of P1 TFT in contact opening 2. The portion 18" over the contact opening 2 is the drain area for the P2 TFT, and also extends over and forms the channel region over the gate electrode of the P2 TFT, as shown in the top view in FIG. 2.

Figure 5:
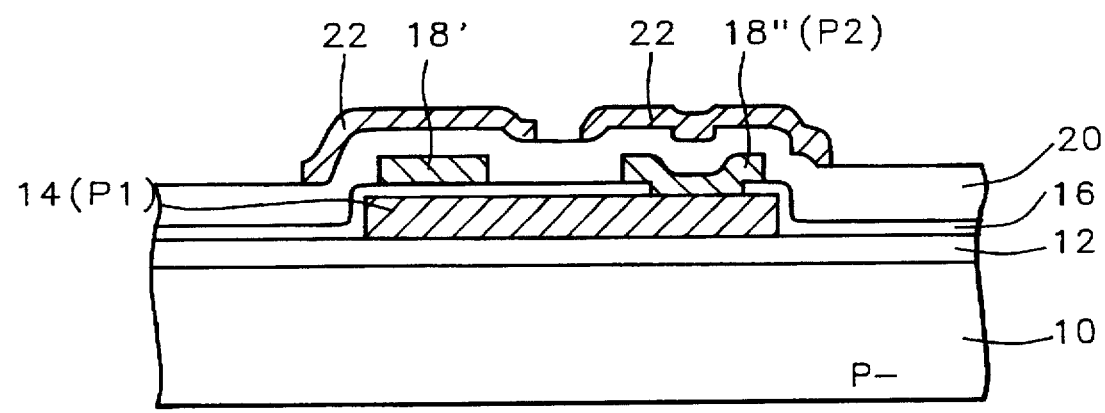

A third insulating layer 20 is now deposited over the patterned third polysilicon layer 18, and serves to electrically insulate the patterned third polysilicon layer 18 from the metal shields that are formed next, as shown in FIG. 5. Layer 20 is preferably composed of a CVD silicon oxide, and is deposited, for example, by plasma enhanced chemical vapor deposition (PECVD) using tetraethosiloxane (TEOS). Typically the thickness of layer 20 is between about 4000 and 9000 Angstroms.

Still referring to FIG. 5, an important feature of this invention is the formation of the metal shields over the channel regions of the TFTs. The shields are formed by depositing a metal layer 22 over the third insulating layer 20, which is then patterned to provide metal portions that completely cover the channel regions of the TFTs. Metal layer 22 is preferably composed of aluminum (Al), but other metal layers can also serve the same function. For example, one can also use metal layers such as titanium-titanium nitride-aluminum copper (Ti/TiN/AlCu). The patterned metal layer 22 is also used to form the bit lines for the SRAM devices. The aluminum layer 22 is preferably deposited by physical vapor deposition (PVD), and more specifically by sputter deposition using an aluminium sputter target. The preferred thickness of layer 22 is between about 4000 and 7000 Angstroms. The metal layer 22 is now patterned to form metal shielding 22 over the TFT channel regions 18'. An important feature of this invention is that the metal shielding protects the channel regions from ionizing damage during the plasma hydrogenation which is carried out next to reduce the interface states at the gate oxide/TFT channel interface.

Still referring to FIG. 5, after forming the metal shielding 22 over the channel regions, such as channel region 18', the substrate is subjected to a plasma hydrogenation which is used to reduce interface traps (states) and to improve TFT characteristics. The plasma hydrogenation is preferably carried out in an ionized hydrogen ambient in a pressure range of between about 800 and 2000 milliTorr for about 2 to 10 hours, at a $H_2$ flow rate of between about 30 and 100 standard cubic centimeters per minute (sccm/min), and at a substrate temperature of between about 225° to 275° C., and more specifically at 250° C.

Figure 6:
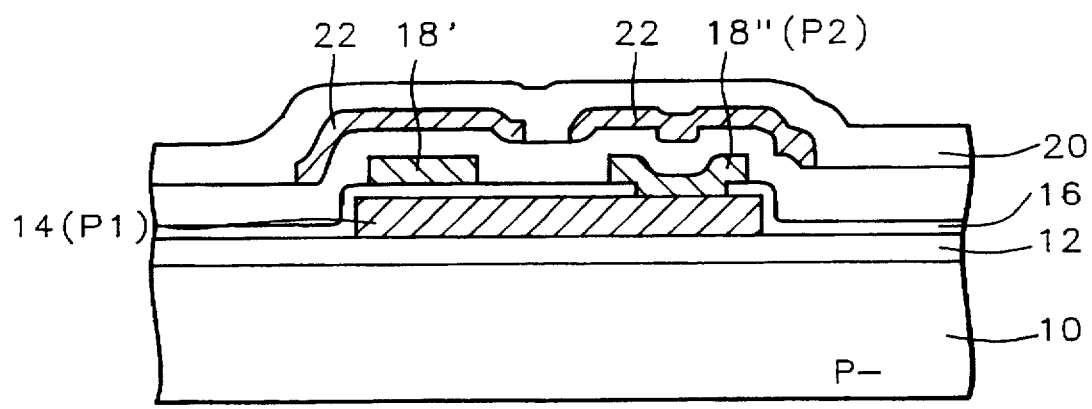

Referring now to FIG. 6, the TFTs are passivated using a fourth insulating layer 24, such as a CVD silicon oxide ($SiO_2$). Layer 24 is preferably deposited by LPCVD using, for example, TEOS as the reactant gas, and is deposited to a thickness of between about 5000 and 9000 Angstroms. This completes the formation of the metal shielded TFTs with improved electrical characteristics.

To better understand the advantages of this invention, an example is provided to show the improved electrical characteristics of these shielded TFTs over the more conventional unshielded TFTs.

EXAMPLE

Figure 7:
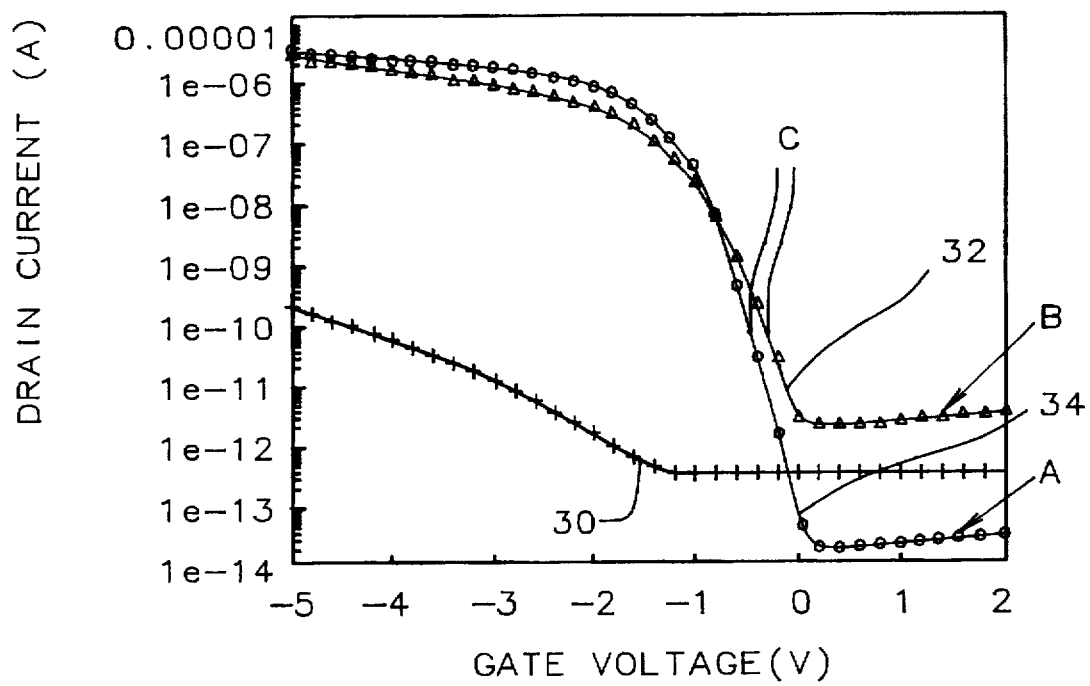
FIG. 7 shows a graph of the drain current versus gate voltage for both the shielded and unshielded thin film transistors showing the improved $I_{on}/I_{off}$ current and the improved threshold swing.

P-channel thin film transistors (P-TFTs) were fabricated by the method of this invention having metal shielding over the channel areas and compared to P-channel TFTs built by the conventional method without shielding. Both TFT types had plasma hydrogenation for 4.0 hours. The TFTs were then electrically characterized to measure the drain current as a function of gate voltage from which the $I_{on}/I_{off}$ current ratio, the threshold swing, and off current were determined for both the shielded and unshielded TFTs, as shown in FIG. 7. The change in threshold voltage ($V_t$) and threshold swing were also measured as a function of stress time to compare the shielded and unshielded TFTs to determine the long-term reliability, as shown respectively in FIGS. 8 and 9.

Shown in FIG. 7 is a plot of the drain current in Ampere (ordinate axis) versus the gate voltage in volts (abscissa axis) for the TFT before hydrogenation (curve 30) and for the TFT with a shielded (curve 34) and unshielded (curve 32) channel regions after hydrogenation. As is clearly seen in the graph of FIG. 7, the I/V characteristics of the TFT after hydrogenation (curves 32 and 34) are substantially improved over the non-hydrogenated TFT. Also, the TFT having the metal shield is significantly better than the unshielded TFT. For example, the off current ($I_{off}$) of the shielded TFT is much lower at about 8 E−14 Ampere (A in FIG. 7) while the $I_{off}$ for the unshielded TFT is 4 E−12 Ampere (B in FIG. 7). Also, this translates into a much improved $I_{on}/I_{off}$ current ratio for the shielded TFT which is about 50 times better than the unshielded TFT. The threshold swing for the shielded TFT is also significantly better than the unshielded TFT as measured by the slope of the curves (point C in FIG. 7). The threshold swing for the unshielded TFT is about 220 millivolts (mV) per decade of drain current, while the threshold swing is only 112 mV per decade, which is 2 times better than the unshielded TFT.

Figure 8:
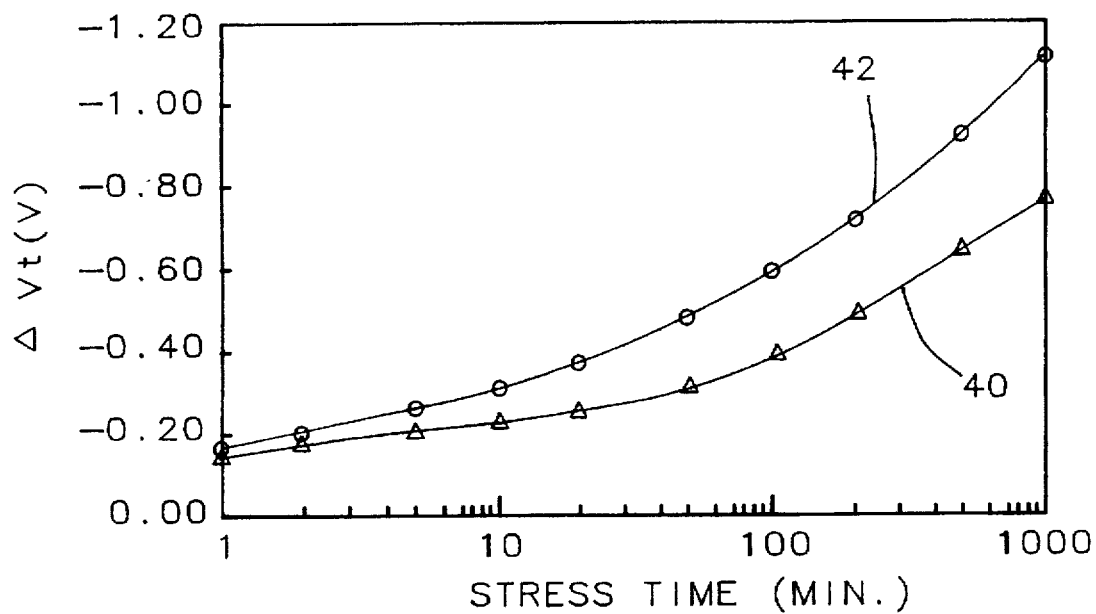
FIG. 8 shows a graph of the improved long-term stability in the threshold voltage for the shielded TFT over the unshielded TFT.

Shown in FIG. 8 is a plot of the change in threshold voltage ($V_t$) in volts (ordinate axis) versus the stress time in seconds (abscissa axis) for a TFT after hydrogenation for the shielded TFT (curve 40) and the unshielded TFT (curve 42) channel regions. Both the shielded and unshielded TFTs are stressed with a gate-to-substrate voltage ($V_{gs}$) at −15 volts with a source/drain voltage ($V_{DS}$) at 0 volts, and is stressed for various times up to 1000 minutes, as shown in FIG. 8. The change in threshold voltage is then determined by subtracting the original threshold voltage from the threshold voltage after stressing $\{V_t=V_t(\text{stressed})-Vt(\text{original})\}$ after each stress time interval. As is clearly shown in the Fig., the change in threshold voltage for the shielded TFT (curve 40) is substantially less than the change in threshold voltage for the unshielded TFT (curve 42). As shown in FIG. 8 after 1000 minutes, the shift in threshold voltage is about 28% less for the shielded TFT.

Figure 9:
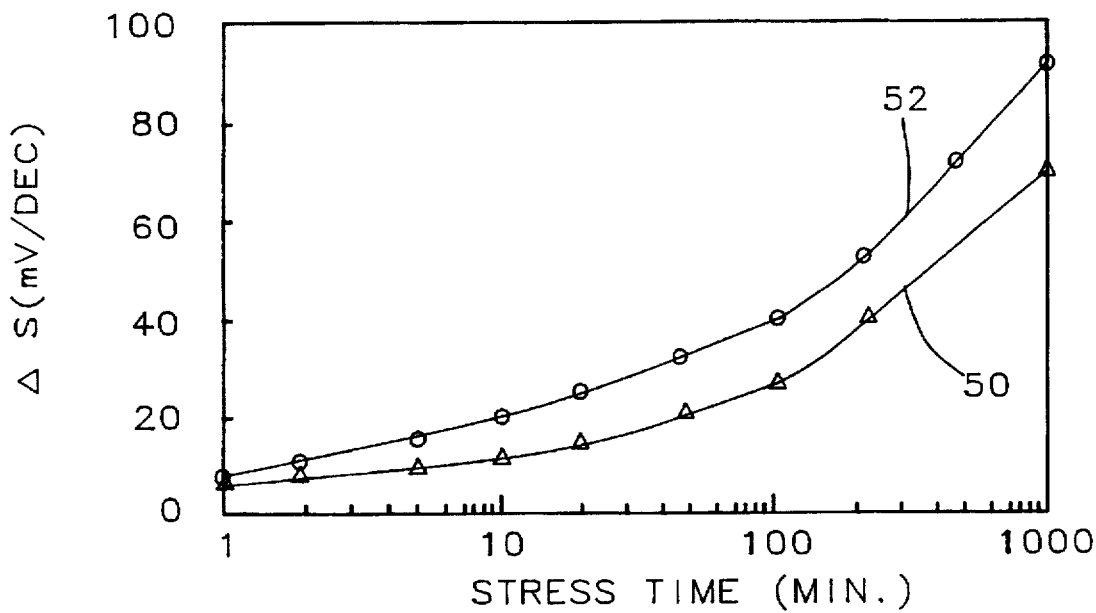
FIG. 9 shows a graph of the improved long-term stability in the threshold swing for the shielded TFT over the unshielded TFT.

Shown in FIG. 9 is a plot of the change in threshold swing (S) measured in millivolts per decade change in drain current (ordinate axis) versus the stress time in seconds (abscissa axis) for the TFT after hydrogenation for the shielded TFT (curve 50) and the unshielded TFT (curve 52) channel regions. Both the shielded and unshielded TFTs are stressed with a gate-to-substrate voltage ($V_{gs}$) at −15 volts with a source/drain voltage ($V_{DS}$) at 0 volts, and is stressed for various times up to 1000 minutes, as shown in FIG. 9. The change in threshold swing is then determined by measuring the slope at point C in FIG. 7 after the various stress time intervals. As is clearly shown in FIG. 9, the change in threshold swing for the shielded TFT (curve 50) is substantially less than the change in threshold voltage for the unshielded TFT (curve 52). For example, as shown in FIG. 9 after 1000 minutes, the shift in threshold swing is about 23% less for the shielded TFT.

While the invention has been particularly shown and described with reference to the preferred embodiments thereof, it will be understood by those skilled in the art that various changes in form and details may be made without departing from the spirit and scope of the invention.

What is claimed is:

1. A thin film transistor with improved electrical characteristics comprised of:

a semiconductor substrate having a partially completed static random access memory (SRAM) device comprised of device areas and field oxide areas and further having field effect transistors (FETs) and word lines formed from a first polysilicon layer, and further thin film transistors comprised of;

a first insulating layer on said substrate;

a patterned second polysilicon layer forming gate electrodes for said thin film transistors;

a second insulating layer forming a gate oxide on said gate electrodes;

a patterned N⁻ doped third polysilicon layer on said second insulating layer over said gate electrodes having ion implanted P doped regions adjacent to said N⁻ doped third polysilicon layer over said gate electrodes, thereby providing N⁻ polysilicon channel regions for said gate electrodes with P-doped portions of said third polysilicon layer providing source/drain regions;

a conformal third insulating layer on said patterned N⁻ polysilicon channel regions and elsewhere on said substrate;

a patterned metal layer on said third insulating layer with portions of said patterned metal extending completely over said N⁻ doped polysilicon channel regions, thereby providing metal shielding for said N⁻ doped channel regions and further exposed to a hydrogen plasma thereby reducing interface traps at the interface between said patterned third polysilicon layer and said gate oxide;

said patterned metal layer also providing bit lines for said static random memory device;

a fourth insulating layer on said patterned metal layer and elsewhere on said substrate, and thereby passivating said thin film transistors.

2. The thin film transistor of claim 1, wherein said metal layer protects the channel regions of said thin film transistors during exposure to said hydrogen plasma.

3. The thin film transistor of claim 1, wherein said metal layer improves $I_{on}/I_{off}$ current, threshold swing, and off current for said thin film transistor.

* * * * *